US 11,800,646 B1

(12) United States Patent
Patel et al.

(10) Patent No.: US 11,800,646 B1
(45) Date of Patent: Oct. 24, 2023

(54) SYSTEMS AND METHODS FOR GENERATING PCB (PRINTED CIRCUIT BOARD) DESIGNS

(71) Applicant: Dell Products, L.P., Round Rock, TX (US)

(72) Inventors: Bhavesh Govindbhai Patel, Austin, TX (US); Arun Chada, Pflugerville, TX (US); Bhyrav M. Mutnury, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/814,272

(22) Filed: Jul. 22, 2022

(51) Int. Cl.
*H05K 3/00* (2006.01)
(52) U.S. Cl.
CPC .................... *H05K 3/0005* (2013.01)
(58) Field of Classification Search
CPC .................................................. H05K 3/0005
See application file for complete search history.

(56) References Cited

U.S. PATENT DOCUMENTS

| 2004/0130334 A1* | 7/2004 | Sparkman | H05K 1/0268 361/752 |
| 2020/0192439 A1* | 6/2020 | Lin | G06F 1/184 |
| 2020/0196437 A1* | 6/2020 | Weng | H05K 1/0245 |

* cited by examiner

*Primary Examiner* — Nghia M Doan
(74) *Attorney, Agent, or Firm* — Fogarty LLP

(57) ABSTRACT

Methods and systems are provided for designing an optimized stack up of layers of a PCB (Printed Circuit Board). A set of constraints is determined for the PCB stack up, where the constraints limit a total number of layers, a number of signal layers, and a thickness of the PCB stack up. Each of the constraints on the PCB stack up is encoded as an equality or an inequality. The set of equalities and inequalities is solved using integer programming techniques to identify an optimal solution to the set of constraints on the PCB stack up, where the optimal solution specifies an arrangement of signaling layers for the PCB. An estimate is generated for impedances and losses for the optimal PCB stack up. The constraints on a PCB stack up are modified when the estimated impedances and losses for the optimal PCB stack up are above a target threshold.

20 Claims, 3 Drawing Sheets

SYSTEMS AND METHODS FOR GENERATING PCB (PRINTED CIRCUIT BOARD) DESIGNS

FIELD

The present disclosure relates generally to Information Handling Systems (IHSs), and relates more particularly to designing PCB (Printed Circuit Boards) used by IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

An IHS may include one or more printed circuit boards (PCBs). A variety of electrical hardware components may be mechanically coupled to a PCB of an IHS. These hardware components coupled to a PCB may include variety of replaceable and non-replaceable components that are electrically coupled to various circuit pathways provided by the PCB. Within a single IHS, PCBs may be utilized within a variety of devices and systems. For instance, PCBs may be used to construct motherboards, backplanes, midplanes, microcontrollers, memory cards, storage devices, peripherals cards (e.g., network interface cards, graphics processor cards) and a wide variety of other electronic components.

A PCB is typically constructed using multiple alternating layers of conductive and insulating materials that are laminated together. The conductive layers of the PCB may be referred to as trace layers and the circuit pathways formed within a conductive layer may be referred to as a trace. Components that are mechanically connected to the PCB may be electrically connected to other components that are connected to the PCB via signaling pathways that are formed from the trace layers, while the alternating resin layers isolate the trace layers from each other and from external sources of signal degradation.

In order to connect trace layers to each other and to the components mechanically coupled to the surface of the PCB, vias may be drilled in the PCB at locations where the traces in different trace layers overlap. The vias may then be filled with a conductive material to connect the circuit pathways in different trace layers. During manufacture of a PCB, each via is formed by drilling a hole through the layers of the PCB, or partially through the PCB, at locations at which the drilled hole intersects with the trace layers to be connected by the via. The entire length of the drilled hole is then filled or coated with a conductive material, thus completing the signal pathway between the layers.

SUMMARY

In various embodiments, methods are provided for designing a stack up of layers of a PCB (Printed Circuit Board). The methods may include: determining a set of constraints on a PCB stack up, where the constraints limit a total number of layers, a number of signal layers, and a thickness of the PCB stack up; encoding each of the set of constraints on the PCB stack up as an equality or an inequality to generate a set of equalities and inequalities; solving the set of equalities and inequalities to identify an optimal solution to the set of constraints on the PCB stack up, wherein the optimal solution comprises an optimal PCB stack up specifying an arrangement of signaling layers for the PCB; generating an estimate of impedances and losses for the optimal PCB stack up; and modifying the set of constraints on a PCB stack up when the estimated impedances and losses for the optimal PCB stack up are above a target threshold.

In some method embodiments, the constraints on the PCB stack up that limit the number of signal layers comprise limits on a number of outer signal layers of the PCB stack up and further comprise limits on a number of inner signal layers of the PCB stack up. In some method embodiments, the constraints on the PCB stack up that limit the thickness of the PCB stack up comprise limits on a total thickness of the PCB stack up. In some method embodiments, the constraints on the PCB stack up that limit the thickness of the PCB stack up comprise limits on a thickness of each respective signal layer of the PCB stack up. In some method embodiments, the constraints on the PCB stack up that limit the number of signal layers comprise limits on a number of successive signal layers of the PCB stack up. In some method embodiments, the set of constraints on the PCB stack up comprise a requirement of a symmetrical arrangement of signal layers in the PCB stack up. In some method embodiments, the set of constraints on the PCB stack up comprise a requirement of identical thicknesses for the symmetrically arranged signal layers in the PCB stack up.

In various additional embodiments, IHSs (Information Handling Systems) may include: one or more CPUs utilizing one or more PCIe (Peripheral Component Interconnect Express) buses that connect to a plurality of DPUs (Data Processing Units); one or computer-readable storage devices having instructions stored thereon for optimized design of a PCB (Printed Circuit Board) stack up, wherein execution of the instructions by the one or more CPUs causes the CPUs to: determine a set of constraints on a PCB stack up, where the constraints limit a total number of layers, a number of signal layers, and a thickness of the PCB stack up; encode each of the set of constraints on the PCB stack up as an equality or an inequality to generate a set of equalities and inequalities; generate an integer programming solution to the set of equalities and inequalities, wherein the integer programming solution is generated based on a plurality of integer programming subproblems that are each transmitted to one or more of the DPUs; identify an optimal solution to the set of constraints on the PCB stack up based on the integer programming solution, wherein the optimal solution comprises an optimal PCB stack up specifying an arrangement of signaling layers for the PCB; generate an estimate of impedances and losses for the optimal PCB stack up; and modify the set of constraints on a PCB stack up when the estimated impedances and losses for the optimal PCB stack up are above a target threshold. IHS embodiments further include the plurality of DPUs, wherein each respective DPU comprises: one or more DPU processor cores; a PCIe interface connecting the DPU to the one or more CPUs; one or more memory devices storing computer-readable instructions that, upon execution by the one or more DPU processor cores, cause a PCB modeling program operating on the DPU processor cores to calculate solutions to one or more of the integer programming subproblems that are transmitted from the one or more CPUs.

In some IHS embodiments, the constraints on the PCB stack up that limit the number of signal layers comprise limits on a number of outer signal layers of the PCB stack up and further comprises limits on a number of inner signal layers of the PCB stack up. In some IHS embodiments, the constraints on the PCB stack up that limit the thickness of the PCB stack up comprise limits on a total thickness of the PCB stack up. In some IHS embodiments, the constraints on the PCB stack up that limit the thickness of the PCB stack up comprise limits on a thickness of each respective signal layer of the PCB stack up. In some IHS embodiments, the constraints on the PCB stack up that limit the number of signal layers comprise limits on a number of successive signal layers of the PCB stack up. In some IHS embodiments, the set of constraints on the PCB stack up comprise a requirement of a symmetrical arrangement of signal layers in the PCB stack up. In some IHS embodiments, the set of constraints on the PCB stack up comprise a requirement of identical thicknesses for the symmetrically arranged signal layers in the PCB stack up. Some IHS embodiments may further include a remote access controller configured to utilize a sideband signaling interface to coordinate the transmission of the integer programming subproblems to the one or more of the DPUs.

In various additional embodiments, computer-readable storage devices include instructions stored thereon for optimized design of a PCB (Printed Circuit Board) stack up. Execution of the instructions by one or more processors causes the one or more processors to: determine a set of constraints on a PCB stack up, where the constraints limit a total number of layers, a number of signal layers, and a thickness of the PCB stack up; encode each of the set of constraints on the PCB stack up as an equality or an inequality to generate a set of equalities and inequalities; solve the set of equalities and inequalities to identify an optimal solution to the set of constraints on the PCB stack up, wherein the optimal solution comprises an optimal PCB stack up specifying an arrangement of signaling layers for the PCB; generate an estimate of impedances and losses for the optimal PCB stack up; and modify the set of constraints on a PCB stack up when the estimated impedances and losses for the optimal PCB stack up are above a target threshold.

In some storage device embodiments, the constraints on the PCB stack up that limit the number of signal layers comprise limits on a number of outer signal layers of the PCB stack up and further comprises limits on a number of inner signal layers of the PCB stack up. In some storage device embodiments, the constraints on the PCB stack up that limit the thickness of the PCB stack up comprise limits on a total thickness of the PCB stack up. In some storage device embodiments, the constraints on the PCB stack up that limit the thickness of the PCB stack up comprise limits on a thickness of each respective signal layer of the PCB stack up. In some storage device embodiments, the constraints on the PCB stack up that limit the number of signal layers comprise limits on a number of successive signal layers of the PCB stack up.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
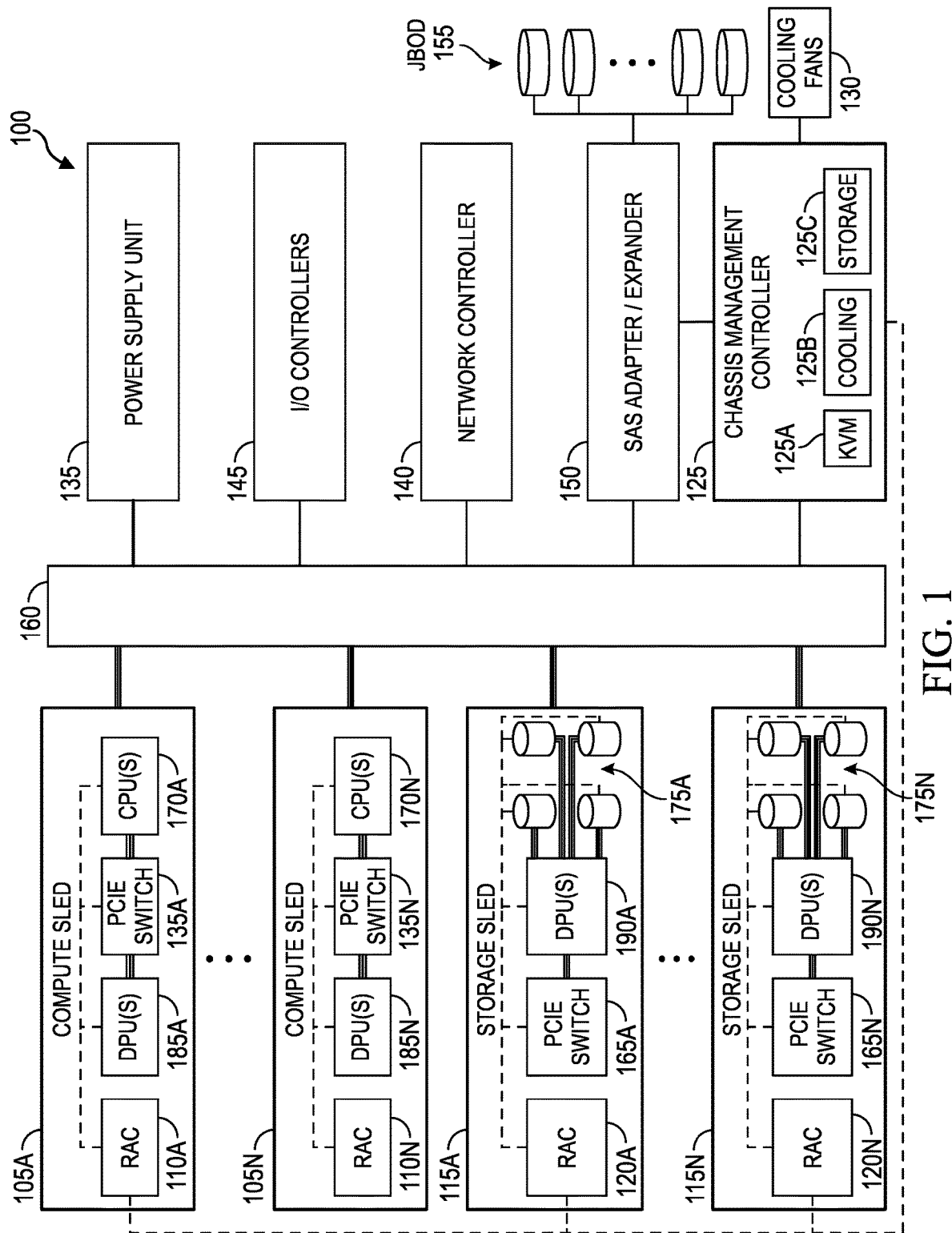
FIG. 1 is a diagram illustrating certain components of a chassis configured, according to some embodiments, for designing PCB (Printed Circuit Boards) used by IHSs installed in the chassis.

FIG. 1 is a block diagram illustrating certain components of a chassis 100 comprising one or more compute sleds 105a-n and one or more storage sleds 115a-n that may be configured to implement the systems and methods described herein for designing PCB (Printed Circuit Boards) used by IHSs installed in the chassis 100. Embodiments of chassis 100 may include a wide variety of hardware configurations in which one or more IHS 105a-n, 115a-n are installed in chassis 100. Such variations in hardware configuration may result from chassis 100 being factory assembled to include components specified by a customer that has contracted for manufacture and delivery of chassis 100. Upon delivery and deployment of a chassis 100, the chassis 100 may be modified by replacing and/or adding various hardware components, in addition to replacement of the removeable IHSs 105a-n, 115a-n that are installed in the chassis.

Chassis 100 may include one or more bays that each receive an individual sled (that may be additionally or alternatively referred to as a tray, blade, and/or node) IHSs, such as compute sleds 105a-n and storage sleds 115a-n. Chassis 100 may support a variety of different numbers (e.g., 4, 8, 16, 32), sizes (e.g., single-width, double-width) and physical configurations of bays. Embodiments may include additional types of sleds that provide various storage, power and/or processing capabilities. For instance, sleds installable in chassis 100 may be dedicated to providing power management or networking functions. Sleds may be individually installed and removed from the chassis 100, thus allowing the computing and storage capabilities of a chassis to be reconfigured by swapping the sleds with different types of sleds, in many cases at runtime without disrupting the ongoing operations of the other sleds installed in the chassis 100.

Multiple chassis 100 may be housed within a rack. Data centers may utilize large numbers of racks, with various different types of chassis installed in various configurations of racks. The modular architecture provided by the sleds, chassis and racks allow for certain resources, such as cooling, power and network bandwidth, to be shared by the compute sleds 105a-n and storage sleds 115a-n, thus providing efficiency improvements and supporting greater computational loads. For instance, certain computational tasks, such as some computational tasks utilized in some artificial intelligence and machine learning systems used according to embodiments for designing PCB (Printed Circuit Boards), may utilize computational and/or storage resources that are shared within an IHS, within a chassis 100 and/or within a set of IHSs that may be spread across multiple chassis of a data center.

In some PCB design systems according to embodiments, processing tasks may be allocated for processing to a specific processing unit of an IHS, such as to a DPU 185a-n, 190a-n that is a supplementary processor that operates separate from the one or more main CPUs of an IHS. Implementing such PCB design systems while spanning processing components of one or more IHSs is aided by high-speed data links between these processing components, such as the illustrated PCIe connections that may be used in forming a PCIe fabric that is implemented by PCIe switches 135a-n, 165a-n installed in these IHSs 105a-n, 115a-n. These high-speed data links may support algorithm implementations that span multiple processing, networking and storage components of an IHS and/or chassis 100 through the use of high-speed PCIe communications that provide data signaling pathways between these components. Due to such complex signaling environments and the increasingly high signaling speeds used to implement such systems, PCB signaling pathways used to support these PCIe communications can suffer from various forms of signal degradation. Certain PCB designs that disburse signaling layers throughout the available layers of the PCB may serve to reduce levels of signal degradation in these signaling pathways. However, as described below, an intractable number of design choices are available when trying to design a PCB that minimizes such signaling limitations.

Chassis 100 may be installed within a rack structure that provides at least a portion of the cooling utilized by the Hs 105a-n, 115a-n installed in chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air away from sleds 105a-n, 115a-n installed within the chassis. In this manner, a rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to the bays provided by the chassis 100 and that physically and electrically couple an individual sled to a backplane 160. Chassis backplane 160 may be a printed circuit board that includes electrical traces and connectors that are configured to route signals between the various components of chassis 100 that are connected to the backplane 160 and between different components mounted on the printed circuit board of the backplane 160. In the illustrated embodiment, the connectors for use in coupling sleds 105a-n, 115a-n to backplane 160 include PCIe couplings that support high-speed data links with the sleds 105a-n, 115a-n. In various embodiments, backplane 160 may include various additional components, such as cables, wires, midplanes, backplanes, connectors, expansion slots, and multiplexers. In certain embodiments, backplane 160 may be a motherboard that includes various electronic components installed thereon. Such components installed on a motherboard backplane 160 may include components that implement all or part of the functions described with regard to the SAS (Serial Attached SCSI) expander 150, I/O controllers 145, network controller 140 and power supply unit 135. In some embodiments, chassis 100 may additionally or alternatively include a midplane, motherboard or other components that include printed circuit boards that themselves include electrical traces and connectors that are configured to route signals between components mounted on these printed circuit boards and/or components coupled to the motherboard.

In supporting increasingly dense arrangements of components within a IHS 105a-n, 115a-n and/or chassis 100, the printed circuit boards that are utilized within a chassis, such as in the backplane, may be incredibly complex. Due to such complexity, a wide range of signal integrity degradations may be observed within such printed circuit boards. Identifying and eliminating sources of signal integrity is complicated by the great number of design options that are viable solutions capable of allowing the components on the motherboard to be effectively powered and coupled to other components, even if a viable solution may be suboptimal. Each electrical trace may be etched at any of the layers of the printed circuit board, with some printed circuit boards having over 20 layers. The routing of signals at each layer is filled with its own multitude of design tradeoffs. Embodiments provide systems supporting an efficient design process for printed circuit boards, such as those used in chassis 100. As described in additional detail below, in some embodiments, an IHS, such as sleds 105a-n, 115a-n may be adapted for implementing machine learning algorithms in generating optimized printed circuit board designs in a manner that provides improved efficiency over existing systems.

Figure 2:
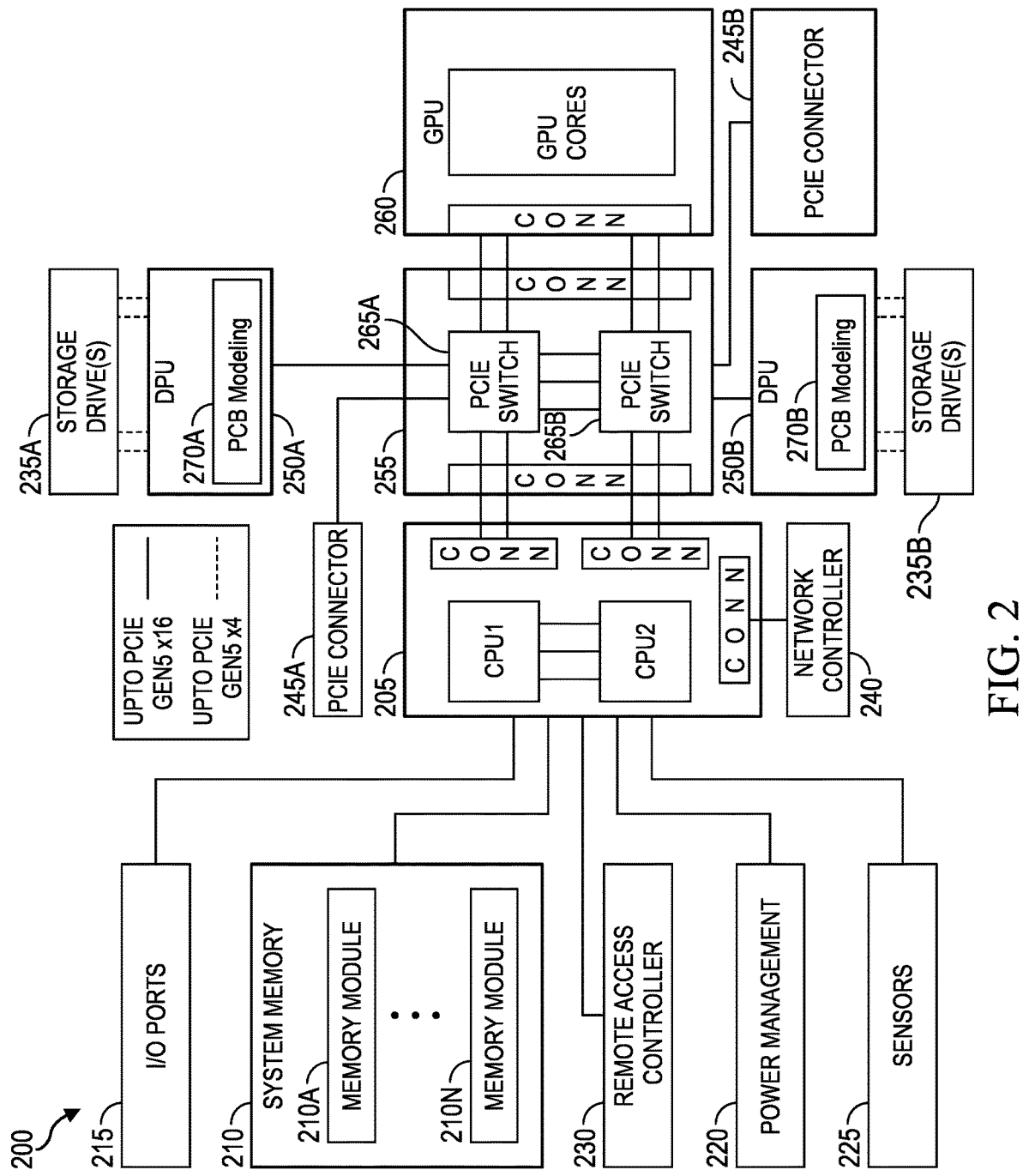
FIG. 2 is a diagram illustrating certain components of an IHS configured, according to some embodiments, for designing PCBs used by the IHS.

In certain embodiments, each individual sled 105a-n, 115a-n -n may be an IHS such as described with regard to IHS 200 of FIG. 2. Sleds 105a-n, 115a-n may individually or collectively provide computational processing resources that may be used to support a variety of e-commerce, multimedia, business and scientific computing applications, such as artificial intelligence systems provided via cloud computing implementations. Sleds 105a-n, 115a-n are typically configured with hardware and software that provide leading-edge computational capabilities. Accordingly, services provided using such computing capabilities are typically provided as high-availability systems that operate with minimum downtime. As described in additional detail with regard to FIG. 2, sleds 105a-n, 115a-n may be configured for general-purpose computing or may be optimized for specific computing tasks.

As illustrated, each sled 105a-n, 115a-n includes a respective remote access controller (RAC) 110a-n, 120a-n. As described in additional detail with regard to FIG. 2, remote access controller 110a-n, 120a-n provides capabilities for remote monitoring and management of a respective sled 105a-n, 115a-n. In support of these monitoring and management functions, remote access controllers 110a-n may utilize both in-band and sideband (i.e., out-of-band) communications with various components of a respective sled 105a-nand chassis 100. Remote access controllers 110a-n, 120a-n may collect various types of sensor data, such as collecting temperature sensor readings that are used in support of airflow cooling of the chassis 100 and the sleds 105a-n, 115a-n. In addition, each remote access controller 110a-n, 120a-n may implement various monitoring and administrative functions related to a respective sleds 105a-n, 115a-n that utilize sideband bus connections with various internal components of the respective sleds 105a-n, 115a-n.

In addition to the data storage capabilities provided by storage sleds 115a-n, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also be remotely located.

As illustrated, chassis 100 also includes one or more storage sleds 115a-n that are coupled to the backplane 160 and installed within one or more bays of chassis 200 in a similar manner to compute sleds 105a-n. Each of the individual storage sleds 115a-n may include various different numbers and types of storage devices. As described in additional detail with regard to FIG. 2, a storage sled 115a-n may be an IHS 200 that includes multiple solid-state drives (SSDs) 175a-n, accessed through a PCIe switch 165a-n by a respective DPU 190a-n of the IHS, where use of the DPU in this manner provides low-latency and high-bandwidth access to the SSDs. Use of NVMe supported by PCIe couplings further supports high-bandwidth and low-latency use of multiple SSDs in parallel. The immense data storage and retrieval capabilities provided by such implementations may be harnessed by offloading storage operations to a DPU 190a-n, and thus without burdening the main CPU of an IHS. As described below, embodiments may utilize these capabilities of DPUs 190a-n in offloading portions of the computations used by a PCB modeling program used to generate optimal PCB designs.

As illustrated, the chassis 100 of FIG. 1 includes a network controller 140 that provides network access to the sleds 105a-n, 115a-n installed within the chassis. Network controller 140 may include various switches, adapters, controllers and couplings used to connect chassis 100 to a network, either directly or via additional networking components and connections provided via a rack in which chassis 100 is installed. Chassis 100 may similarly include a power supply unit 135 that provides the components of the chassis with various levels of DC power from an AC power source or from power delivered via a power system provided by a rack within which chassis 100 may be installed. In certain embodiments, power supply unit 135 may be implemented within a sled that may provide chassis 100 with redundant, hot-swappable power supply units.

Chassis 100 may also include various I/O controllers 140 that may support various I/O ports, such as USB ports that may be used to support keyboard and mouse inputs and/or video display capabilities. Such I/O controllers 145 may be utilized by the chassis management controller 125 to support various KVM (Keyboard, Video and Mouse) 125a capabilities that provide administrators with the ability to interface with the chassis 100. The chassis management controller 125 may also include a storage module 125c that provides capabilities for managing and configuring certain aspects of the storage devices of chassis 100, such as the storage devices provided within storage sleds 115a-n and within the JBOD 155.

In addition to providing support for KVM 125a capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125b of the chassis management controller 125.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 illustrates an example of an IHS 200 configured to implement systems and methods described herein for designing PCBs (Printed Circuit Boards), where these PCBs may themselves be components of the IHS 200, such as PCBs from which the motherboard of IHS 200 is constructed. It should be appreciated that although the embodiments described herein may describe an IHS that is a compute sled or similar computing component that may be deployed within the bays of a chassis, a variety of other types of IHSs, such as laptops and portable devices, may also utilize printed circuit boards that have been designed according to embodiments described herein. In the illustrative embodiment of FIG. 2, IHS 200 may be a computing component, such as sled 105a-n, 115a-n or other type of server, such as an 1RU server installed within a 2RU chassis, that is configured to share infrastructure resources provided within a chassis 100.

IHS 200 may utilize one or more system processors 205, that may be referred to as CPUs (central processing units). In some embodiments, CPUs 205 may each include a plurality of processing cores that may be separately assigned computing tasks.

Each of the CPUs 205 may be individually designated as a main processor and as a co-processor, where such designations may be based on delegation of specific types of computational tasks to a CPU 205. In some embodiments, CPUs 205 may each include an integrated memory controller that may be implemented directly within the circuitry of each CPU 205. In some embodiments, a memory controller may be a separate integrated that is located on the same die as the CPU 205. Each memory controller may be configured to manage the transfer of data to and from a system memory 210 of the IHS, in some cases using a high-speed memory interface. The system memory 210 is coupled to CPUs 205 via one or more memory buses that provide the CPUs 205 with high-speed memory used in the execution of computer program instructions by the CPUs 205. Accordingly, system memory 210 may include memory components, such as static RAM (SRAM), dynamic RAM (DRAM), NAND Flash memory, suitable for supporting high-speed memory operations by the CPUs 205. In certain embodiments, system memory 210 may combine persistent non-volatile memory and volatile memory.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a removable memory module 210a-n, such as a DIMM (Dual In-line Memory Module), that can be coupled to the socket and then decoupled from the socket as needed, such as to upgrade memory capabilities or to replace faulty memory modules. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each CPU 205. All or portions of the chipset may be implemented directly within the integrated circuitry of an individual CPU 205. The chipset may provide the CPU 205 with access to a variety of resources accessible via one or more in-band buses 205a. IHS 200 may also include one or more I/O ports 215 that may be used to couple the IHS 200 directly to other IHSs, storage resources, diagnostic tools, and/or other peripheral components. A variety of additional components may be coupled to CPUs 205 via a variety of busses. For instance, CPUs 205 may also be coupled to a power management unit 220 that may interface with a power system of the chassis 100 in which IHS 200 may be installed. CPUs 205 may collect information from one or more sensors 225 via a management bus.

In certain embodiments, IHS 200 may operate using a BIOS (Basic Input/Output System) that may be stored in a non-volatile memory accessible by the CPUs 205. The BIOS may provide an abstraction layer by which the operating system of the IHS 200 interfaces with hardware components of the IHS. Upon powering or restarting IHS 200, CPUs 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for execution by CPUs 205. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 230.

In some embodiments, IHS 200 may include a TPM (Trusted Platform Module) that may include various registers, such as platform configuration registers, and a secure storage, such as an NVRAM (Non-Volatile Random-Access Memory). The TPM may also include a cryptographic processor that supports various cryptographic capabilities. In IHS embodiments that include a TPM, a pre-boot process implemented by the TPM may utilize its cryptographic capabilities to calculate hash values that are based on software and/or firmware instructions utilized by certain core components of IHS, such as the BIOS and boot loader of IHS 200. These calculated hash values may then be compared against reference hash values that were previously stored in a secure non-volatile memory of the IHS, such as during factory provisioning of IHS 200. In this manner, a TPM may establish a root of trust that includes core components of IHS 200 that are validated as operating using instructions that originate from a trusted source.

As described, IHS 200 may include a remote access controller 230 that supports remote management of IHS 200 and of various internal components of IHS 200. In certain embodiments, remote access controller 230 may operate from a different power plane from the CPUs 205 and from other components of IHS 200, thus allowing the remote access controller 230 to operate, and management tasks to proceed, while the processing cores of IHS 200 are powered off. As described, various functions provided by the BIOS, including launching the operating system of the IHS 200, may be implemented by the remote access controller 230. In some embodiments, the remote access controller 230 may perform various functions to verify the integrity of the IHS 200 and its hardware components prior to initialization of the operating system of IHS 200 (i.e., in a bare-metal state).

Remote access controller 230 may include a service processor, or specialized microcontroller, that operates management software that provides remote monitoring and administration of IHS 200. Remote access controller 230 may be installed on the motherboard, backplane, midplane, etc. of IHS 200, or may be coupled to IHS 200 via an expansion slot connector provided the IHS. In support of remote monitoring functions, remote access controller 230 may include a dedicated network adapter that may support management connections by remote access controller 230 using wired and/or wireless network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 230 may support monitoring and administration of various managed devices of an IHS via a sideband bus interface 230a. For instance, messages utilized in device management may be transmitted using I2C sideband bus 230a connections that may be established with each of the managed devices. These managed devices of IHS 200, such as specialized hardware, network controllers 240, sensors 225, and storage drives 235a-b, may be connected to the CPUs 205 via in-line buses, such as the described PCIe switch fabric, that is separate from the I2C sideband bus 230a connections used by the remote access controller 230 for device management. As described in additional detail with regard to FIG. 3, in some embodiments, remote access controller 230 may utilize this sideband bus 230a in collecting signal integrity data and device status information from managed devices of IHS 200, such as PCIe switches 265a-b, storage devices 235a-b, DPU 250a-b, where this signal integrity data and device status information may be used by embodiments in order to offload portions of the PCB design computations to DPUs 250a-b, thus reducing the time required for convergence by the algorithms in use by the PCB modeling program.

As illustrated, CPUs 205 may be coupled to a network controller 240, such as provided by a Network Interface Controller (NIC) card that provides IHS 200 with communications via one or more external networks, such as the Internet, a LAN, or a WAN. In some embodiments, network controller 240 may be a replaceable expansion card or adapter that is coupled to a connector (e.g., connection of a motherboard, backplane, midplane, etc.) of IHS 200. In some embodiments, network controller 240 may support high-bandwidth network operations through a PCIe coupling accessible by the chipsets of CPUs 205.

As indicated in FIG. 2, in some embodiments, CPUs 205 may be coupled to a PCIe card 255 that includes two PCIe switches 265*a-b* that operate as I/O controllers for PCIe communications, such as TLPs (Transaction Layer Packets), that are transmitted between the CPUs 205 and PCIe devices and systems coupled to IHS 200. Whereas the illustrated embodiment of FIG. 2 includes two CPUs 205 and two PCIe switches 265*a-b*, different embodiments may operate using different numbers of CPUs and PCIe switches. In addition to serving as I/O controllers that route PCIe traffic, PCIe switches 265*a-b* include switching logic that can be used to expand the number of PCIe connections that are supported by CPUs 205. PCIe switches 265*a-b* may multiply the number of PCIe lanes available to CPUs 205, thus allowing more PCIe devices to be connected to CPUs 205, and for the available PCIe bandwidth to be allocated with greater granularity. In some instances, the switching logic of PCIe switches 265*a-b* that is used to route PCIe transmissions are connected to CPUs 205 via upstream ports and are connected to PCIe devices via downstream ports that multiply the number of upstream ports, thus distributing the available PCIe bandwidth of the upstream ports to the downstream ports. The PCIe bandwidth that is available in each of these downstream ports may be configured through allocating one or more PCIe lanes to a specific port and also by specifying a transmission speed for the port, such as 16 Gbps, 32 Gbps, 64 Gbps.

As illustrated, PCIe switch 265*a* is coupled via PCIe connections to a DPU 250*a* that may be a connected to the IHS via a removeable card that couples to a PCIe connector of the IHS. Also as illustrated, rather than utilize a PCIe switch, DPU 250*b* is coupled via a PCIe connection directly to CPUs 205. PCIe switch 265*b* may also be connected to the IHS via a removeable card that couples to a PCIe connector of the IHS. Each of the DPUs 250*a-b* includes a programmable processor that can be configured for offloading functions from CPUs 205. In some embodiments, DPUs 250*a-b* may be programmed to process offloaded computations that are used in the described technique for designing printed circuit boards, thus sparing CPUs 205 from a significant number of interrupts required to support such algorithms and gaining efficiency through the use of specialized implementations of these offloaded PCB design computations that can be achieved using the programmable logic of the DPUs 250*a-b*.

In some embodiments, DPUs 250*a-b* may include a plurality of programmable processing cores and/or hardware accelerators, that may be used to implement functions used to support devices coupled to the IHS 200. In the illustrated embodiment, DPUs 250*a-b* implement functions used to support storage drives 235*a-b*, such as SSDs (solid-state drives). For instance, DPUs 250*a-b* may implement processing of PCIe communications with SSD storage drives 235*a-b* that support NVMe protocols that support the use of high-bandwidth PCIe connections with SSDs. DPUs 250*a-b* may also each include one more memory devices that may be used to store program instructions executed by the processing cores and/or used to support the operation of SSD storage drives 235*a-b*, such as in implementing cache memories and buffers utilized in support of the storage drives.

In some embodiments, the processing cores of DPUs 250*a-b* include ARM (advanced RISC (reduced instruction set computing) machine) processing cores. In other embodiments, the cores of DPUs 250*a-b* may include MIPS (microprocessor without interlocked pipeline stages) cores, RISC-V cores, or CISC (complex instruction set computing) (i.e., x86) cores. Each core of the DPUs 250*a-b* may be programmed to perform functions that support operation of SSD storage drives 235*a-b*, such as processing of PCIe packets that are transmitted in executing read, write and other I/O operations on these storage drives 235*a-b*. In some embodiments, DPUs 250*a-b* may be implemented through integrated circuits mounted on a printed circuit board (e.g., a replaceable card) that is coupled to the motherboard, backplane, midplane or other printed circuit board of the IHS. In some instances, the printed circuit board on which DPUs 250*a-b* are mounted may be designed utilizing the embodiments described herein. In some embodiments, PCIe busses may be utilized both in the couplings connecting DPUs 250*a-b* to the IHS 200 and in the couplings connecting the DPUs 250*a-b* to the SSD storage drives 235*a-b*. In other embodiments, DPUs 250*a-b* may implement operations in support of other types of devices and may similarly support high-bandwidth PCIe connections with these devices. For instance, in various embodiments, DPUs 250*a-b* may support high-bandwidth connections, such as PCIe connections, with networking devices in implementing functions of a network switch, compression and codec functions, virtualization operations or cryptographic functions.

As indicated in FIG. 2, DPUs 250*a-b* each operate a PCB modeling program 270*a-b*. As describe in further detail below, the PCB modeling functions implemented by the DPUs 250*a-b* may be configured to calculate a portion of the PCB design calculations, as assigned by the core portion of the PCB modeling program that is operating on the CPUs 205 or GPUs 260 of the IHS 200. In such instances, the core portion of the PCB modeling program may identify available computing resources, such as DPUs 250*a-b*, and may query their current computational capabilities. In some embodiments, the computational capabilities of DPUs 250*a-b* may be determined in part based on information collected via sideband management connections 230*a* by remote access controller 230. As described in additional detail below, embodiments represent a PCB design as a set of integer programming constraints that are expressed as a set of equalities and inequalities. The PCB modeling program then identifies an optimal solution to the set of equations that represent the constraints. Through offloading some of these calculations to DPUs 250*a-b*, the PCB modeling program provides improved convergence times over existing PCB design methodologies.

In addition to supporting high-bandwidth PCIe couplings with CPUs 205, as illustrated in FIG. 2, PCIe switches 265*a-b* may also support PCIe couplings with one or more GPUs (Graphics Processing Units) 260. Embodiments may include one or more GPU cards, where each GPU card is coupled to one or more of the PCIe switches 265*a-b*, and where each GPU card may include one or more GPUs 260. In some embodiments, PCIe switches 265*a-b* may transfer instructions and data for generating video images by the GPUs 260 to and from CPUs 205. Accordingly, GPUs 260 may include on or more hardware-accelerated processing cores that are optimized for performing streaming calculation of vector data, matrix data and/or other graphics data, thus supporting the rendering of graphics for display on devices coupled either directly or indirectly to IHS 200. In some instances, the printed circuit board of cards on which GPUs 260 are mounted may be designed utilizing the embodiments described herein.

As illustrated in FIG. 2, PCIe switches 265a-b may support PCIe connections in addition to those utilized by GPUs 260 and DPUs 250a-b, where these connections may include PCIe links of one or more lanes. For instance, PCIe connectors 245a-b supported by printed circuit board of IHS 200 may allow various other systems and devices to be coupled to IHS. Through couplings to PCIe connectors 245a-b, a variety of data storage devices, graphics processors and network interface cards may be coupled to IHS 200.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
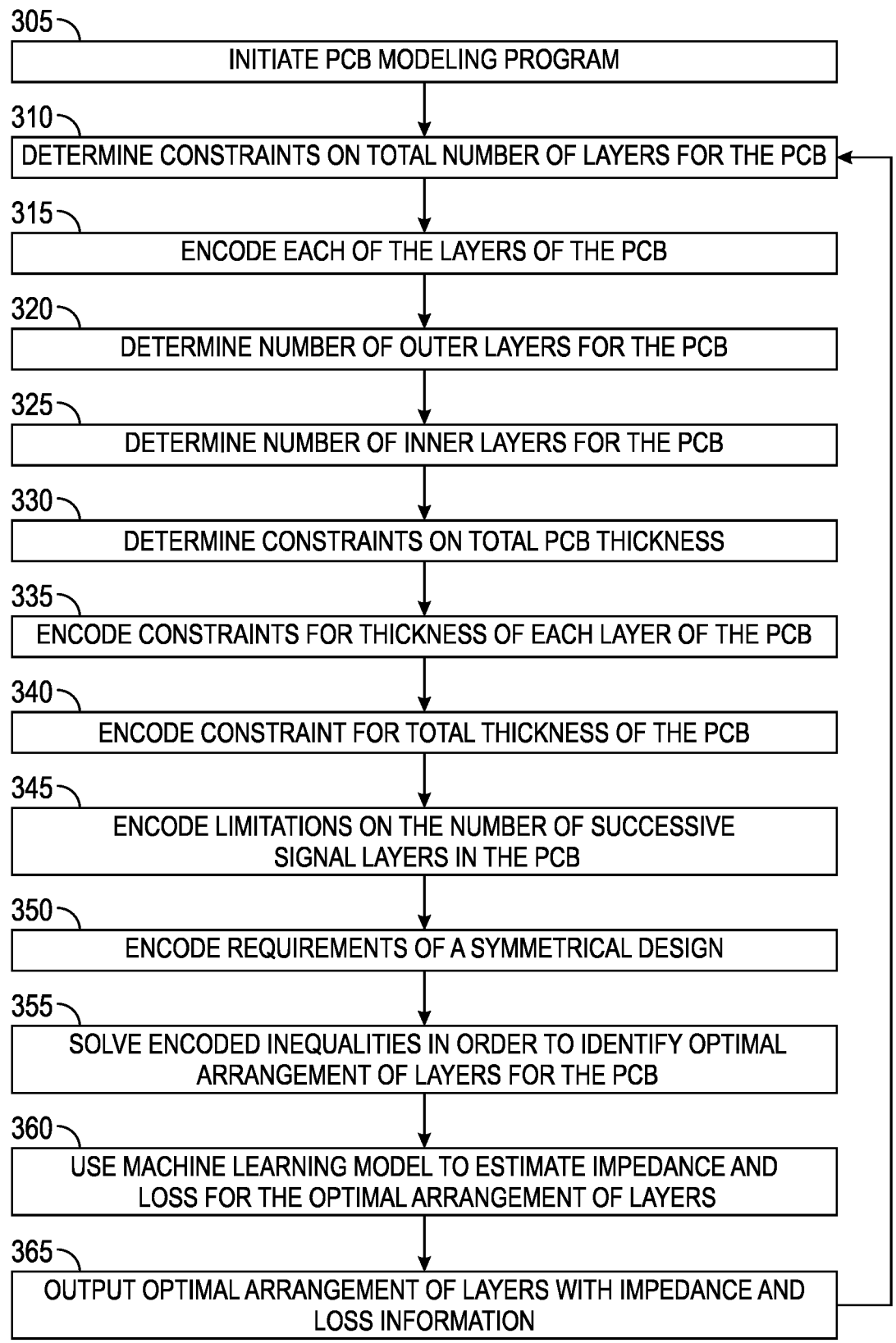
FIG. 3 is a flowchart describing certain steps of a method, according to some embodiments, for designing PCBs used by IHSs.

FIG. 3 is a flowchart describing certain steps of a method, according to some embodiments, for designing PCBs used by IHSs and chassis, such as the IHSs and chassis described with regard to FIGS. 1 and 2. Some embodiments may begin, at block 305, with the initialization of a PCB design modeling program, such as by a CPU or GPU of an IHS, such as those described with regard to FIGS. 1 and 2. As described above, the IHS and chassis embodiments described with regard to FIGS. 1 and 2 may include PCBs designed according to the embodiments described in addition. Additionally or alternatively, the IHS and chassis embodiments described with regard to FIGS. 1 and 2 may be utilized to operate the PCB design modeling program described with regard to FIG. 3.

As described, PCBs in modern IHSs are highly complex due to requirements for supporting a dense arrangement of components. As signaling transmission speeds increase in these PCBs, a wide variety of signal degradations and other losses may be exhibited. Due to the complexity of modern PCB designs, diagnosing such issues can be extremely complicated, if not intractable. Accordingly, embodiments provide capabilities for optimizing PCB designs in a manner that minimizes signal integrity degradations and other losses in the PCB. Existing systems are increasingly unable to provide reasonable convergence times for generating optimized PCB designs. Modern PCBs have upwards of 20 conductive layers that may each be used as a signaling layer, power layer or ground layer. Accordingly, the number of permutations for possible arrangement of the stack up of layers of a PCB are immense. Embodiments provide an efficient technique for determining the arrangement of signaling layers within a PCB stack up.

Once the PCB design program has been initialized, constraints on the PCB design are collected and encoded. As illustrated in FIG. 3, some embodiment may proceed, at 310, with a determination of constraints on the total number of layers (L) that will be included in the PCB. In some scenarios, the total number of layers (L) to be supported will have a strict upper limit due to manufacturing limitations. In general, fewer layers in a PCB stack up results in lower manufacturing costs for the PCB, and is thus preferred. However, more layers may provide improved shielding for the signal layers within the PCB, thus reducing impedances and losses, and thus supporting more power efficient designs that can support faster signaling transmission speeds. Accordingly, selecting the optimal number of layers for a PCB design can itself be a time-consuming task when attempted manually.

At 315, embodiments may encode the total number of layers. For instance, for the total number of layers (L), each layer (x) may be encoded as the equality:

$$X_0, X_1, \ldots, X_{L-1}, X_i = \{0, 1\}$$

This encoding of the layers allows each of the possible layers to be utilized as a signaling layer (1) or excluded from signaling (0) in the PCB stack up. Embodiments may continue, at 320, by determining constraints on the number of outer signal layers (M) of the PCB stack up, where outer signal layers are PCB layers etched with signaling traces that are the topmost or bottommost layers of the PCB stack up. Due to being adjacent to the top or bottom surface of the PCB, outer signal layers have different impedance and loss characteristics compared to inner signaling layers. As such, an optimal PCB design may have zero, one, or two outer signal layers (M). With the number of outer signal layers determined, at 325, the number of outer signal layers (M) and inner signal layers (N) may be specified according to the equality:

$$L = (N+M) = \Sigma_i, \text{ where } X_0 + X_{L-1} = M$$

With the constraints on the numbers and types of signaling layers specified, at 330, embodiments may continue by determining constraints on the total thickness (T) of the PCB stack up. In some instances, the total thickness (T) of the PCB may have a strict upper limit due to manufacturing limitations. The total thickness (T) of the PCB may also have a strict lower limit due to minimal levels of stability and rigidity that are required for the PCB in order to support installation of connectors and other components. Similarly, embodiments may determine constraints on the thickness of individual signal layers (y) of the PCB stack up, where the thickness of the individual signal layers may have a strict lower limit (e.g., 6 µm), such as due to the shielding and manufacturing constraints, and may have an upper limit (e.g., 40 µm), such as due to manufacturing constraints and attenuated additional shielding benefits for layers greater than this thickness. As illustrated, at 335, embodiments may proceed by encoding the constraints for the thickness of each individual signal layer (y) as follows:

$$y_0, y_1, \ldots, y_{L-2}, \text{ where lower limit} \leq y_j \leq \text{upper limit}$$

At 340, the constraints on the total thickness (T) of the PCB may be encoded with tolerances of 1.5 mm as:

$$T - 1.5 \leq \Sigma y_j \leq T + 1.5$$

With the constraints on the thicknesses of the PCB and the individual signal layers encoded, at 345, embodiments may encode limitations on the number of successive signal layers (e.g., no more than 3 successive signal layers that are adjacent to each other in the PCB stack up) that may be utilized in the PCB stack up as:

$$X_j + X_{j+1} + X_{j+2} \leq 2$$

Constraints on the number of successive signal layers prevents interference levels from reaching levels that are known to cause deteriorations in signal integrity. In the scenario limiting successive signal layers to three within a PCB stack up, having four consecutive signal layers would be expected to result in significant signal degradations in some or all of the four successive signal layers. Additional constraints that may be encoded by embodiments may include constraints requiring symmetrical PCB designs, where these constrains may be encoded as:

$X_j = X_{L-j-1}$ and $y_j = y_{L-j-2}$

Symmetrical PCB designs may require a symmetrical arrange of signal layers within the stack of layers of the PCB, where this symmetry may require signal layers be located at symmetrical locations in the PCB stack, and where these signal layers at symmetrical locations in the PCB stack must be of the same thickness. With all of the constraints on the PCB stack up encoded as inequalities or equalities, at 355, embodiments may proceed to solving the set of equations in order to identify the optimal arrangement of signal layers for the PCB stack up.

In representing the PCB constraints as a set of equations that include equalities and inequalities, integer programming may be used by embodiments to calculate an optimal solution to that set of equations. Using existing solution techniques for computations that are expressed as integer programming problems, embodiments may solve the set of equations in order to find an optimal PCB stack up. Various integer programming techniques may be utilized in calculating a solution, such as branch-and-bound, heuristics and/or cutting planes, in traversing and reducing the size of the PCB constraint search space.

Through representation of the constraints on the PCB as a set of integer programming equations, embodiments support the ability to support parallel computation of portions of the algorithms used in finding an optimal PCB stack up. As described above, an IHS may include one or more DPUs (Data Processing Units) that may be used to provide supplementary processing capabilities that allow offloading of certain computational tasks from the main CPU(s) of the IHS. In such embodiments, portions of the integer programming solution may be assigned to the different DPUs that are available in an IHS, thus supporting parallel processing towards an optimal solution to the set of equations. For instance, in embodiments employing branch and bound techniques for solving the set of equations specifying the PCB constraints, portions of the branch and bound calculations may be delegated to a DPU for calculation, such as calculation that operate using a branch of the root set of PCB constraints in an attempt to utilize a more relaxed version of the PCB constraints, thus promoting a faster convergence on an optimized solution, even if the solution is not a global optimum. In this manner, embodiments may dispatch branch and bound calculations to the PCB modeling clients operated by the DPUs of the IHS, such as PBC modeling programs 270*a-b* operating of DPUs 250*a-b*. Embodiments may similarly dispatch portions of the integer programming calculation to PBC modeling programs 270*a-b*, such as dispatching optimizations of individual layer thicknesses (y), in a manner that supports parallel calculation of a solution.

As described above, a DPU may include programmable logic components, such as one or more ARM cores, and memory devices capable of storing program instructions and data for used by the logic components. Utilizing these capabilities of DPU, a PCB modeling program may be implemented using program instructions that are stored in these memory devices of DPU and that are executed using the processing cores, such as an ARM core, of the DPU. The PCB modeling program may be initiated by the DPU based on instructions provided from the CPU/GPU on which the core of the PCB design model is being run. In some embodiments, DPU may initialize the PCB design program based on instructions by the remote access controller that utilizes its sideband management connections in order to coordinate the operation of PCB design client programs operating on processing cores of multiple different DPUs installed in the IHS in support of parallel computation of the PCB design optimizations.

Once an optimal PCB stack up has been calculated in light of the set of PCB constraints, whether through computations by a CPU, GPU and/or DPU, at 360, a machine learning model may be utilized in order to estimate expected impedances and losses for the stack up of layers of the optimal PCB stack up. In various embodiments, the PCB modeling program may utilize one or more machine learning algorithms (e.g., neural networks, Bayesian networks, Markov models, etc.) to estimate impedances and losses in the calculated PCB design stack up, where the estimates are generated based on existing machine learning models that are used to analyze impedances in candidate PCB designs.

At 365, the PCB modeling program outputs the optimal stack up of PCB layers and the estimated impedances and losses associated with the stack up of layers. Based on this data, the sufficiency of the generated PCB stack up may be evaluated, either automatically or manually. For instance, a PCB stack up generated by the modeling program may be rejected due to unacceptable power losses, unacceptably high impedance levels, and/or unacceptable levels of signal integrity degradation. In such instances, the constraints described above may be modified and the PCB modeling program may be re-run to find an optimal PCB stack up of layers in light of these updated constraints. Inventors have recognized that use of the embodiments described herein enables significantly improved convergences of PCB design processes. Where existing techniques for generation of optimized PCB stack ups take days to converge, embodiments provide solutions in the order of hours for PCB stack ups of greater than 20 layers.

\*\*\*

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for designing a stack up of layers of a PCB (Printed Circuit Board), the method comprising:
   determining a set of constraints on a PCB stack up, where the constraints limit a total number of layers, a number of signal layers, and a thickness of the PCB stack up;
   encoding each of the set of constraints on the PCB stack up as an equality or an inequality to generate a set of equalities and inequalities equations;
   solving the set of equalities and inequalities equations to identify an optimal solution to the set of constraints on the PCB stack up, wherein the optimal solution comprises an optimal PCB stack up specifying an arrangement of signaling layers for the PCB;
   generating an estimate of impedances and losses for the optimal PCB stack up; and
   modifying the set of constraints on a PCB stack up when the estimated impedances and losses for the optimal PCB stack up are above a target threshold.

2. The method of claim 1, wherein the constraints on the PCB stack up that limit the number of signal layers comprise limits on a number of outer signal layers of the PCB stack up and further comprise limits on a number of inner signal layers of the PCB stack up.

3. The method of claim 1, wherein the constraints on the PCB stack up that limit the thickness of the PCB stack up comprise limits on a total thickness of the PCB stack up.

4. The method of claim 1, wherein the constraints on the PCB stack up that limit the thickness of the PCB stack up comprise limits on a thickness of each respective signal layer of the PCB stack up.

5. The method of claim 1, wherein the constraints on the PCB stack up that limit the number of signal layers comprise limits on a number of successive signal layers of the PCB stack up.

6. The method of claim 1, wherein the set of constraints on the PCB stack up comprise a requirement of a symmetrical arrangement of signal layers in the PCB stack up.

7. The method of claim 6, wherein the set of constraints on the PCB stack up comprise a requirement of identical thicknesses for the symmetrically arranged signal layers in the PCB stack up.

8. An IHS (Information Handling System) comprising:
   one or more CPUs utilizing one or more PCIe (Peripheral Component Interconnect Express) buses that connect to a plurality of DPUs (Data Processing Units);
   one or computer-readable storage devices having instructions stored thereon for optimized design of a PCB (Printed Circuit Board) stack up, wherein execution of the instructions by the one or more CPUs causes the CPUs to:
      determine a set of constraints on a PCB stack up, where the constraints limit a total number of layers, a number of signal layers, and a thickness of the PCB stack up;
      encode each of the set of constraints on the PCB stack up as an equality or an inequality to generate a set of equalities and inequalities equations;
      generate an integer programming solution to the set of equalities and inequalities equations, wherein the integer programming solution is generated based on a plurality of integer programming subproblems that are each transmitted to one or more of the DPUs;
      identify an optimal solution to the set of constraints on the PCB stack up based on the integer programming solution, wherein the optimal solution comprises an optimal PCB stack up specifying an arrangement of signaling layers for the PCB;
      generate an estimate of impedances and losses for the optimal PCB stack up; and
      modify the set of constraints on a PCB stack up when the estimated impedances and losses for the optimal PCB stack up are above a target threshold; and
   the plurality of DPUs, wherein each respective DPU comprises:
      one or more DPU processor cores;
      a PCIe interface connecting the DPU to the one or more CPUs;
      one or more memory devices storing computer-readable instructions that, upon execution by the one or more DPU processor cores, cause a PCB modeling program operating on the DPU processor cores to:
         calculate solutions to one or more of the integer programming subproblems that are transmitted from the one or more CPUs.

9. The IHS of claim 8, wherein the constraints on the PCB stack up that limit the number of signal layers comprise limits on a number of outer signal layers of the PCB stack up and further comprises limits on a number of inner signal layers of the PCB stack up.

10. The IHS of claim 8, wherein the constraints on the PCB stack up that limit the thickness of the PCB stack up comprise limits on a total thickness of the PCB stack up.

11. The IHS of claim 8, wherein the constraints on the PCB stack up that limit the thickness of the PCB stack up comprise limits on a thickness of each respective signal layer of the PCB stack up.

12. The IHS of claim 8, wherein the constraints on the PCB stack up that limit the number of signal layers comprise limits on a number of successive signal layers of the PCB stack up.

13. The IHS of claim 8, wherein the set of constraints on the PCB stack up comprise a requirement of a symmetrical arrangement of signal layers in the PCB stack up.

14. The IHS of claim 13, wherein the set of constraints on the PCB stack up comprise a requirement of identical thicknesses for the symmetrically arranged signal layers in the PCB stack up.

15. The IHS of claim 8, further comprising a remote access controller configured to utilize a sideband signaling interface to coordinate the transmission of the integer programming subproblems to the one or more of the DPUs.

16. A computer-readable storage device having instructions stored thereon for optimized design of a PCB (Printed Circuit Board) stack up, wherein execution of the instructions by one or more processors causes the one or more processors to:

determine a set of constraints on a PCB stack up, where the constraints limit a total number of layers, a number of signal layers, and a thickness of the PCB stack up;

encode each of the set of constraints on the PCB stack up as an equality or an inequality to generate a set of equalities and inequalities equations;

solve the set of equalities and inequalities equations to identify an optimal solution to the set of constraints on the PCB stack up, wherein the optimal solution comprises an optimal PCB stack up specifying an arrangement of signaling layers for the PCB;

generate an estimate of impedances and losses for the optimal PCB stack up; and modify the set of constraints on a PCB stack up when the estimated impedances and losses for the optimal PCB stack up are above a target threshold.

17. The storage device of claim 16, wherein the constraints on the PCB stack up that limit the number of signal layers comprise limits on a number of outer signal layers of the PCB stack up and further comprises limits on a number of inner signal layers of the PCB stack up.

18. The storage device of claim 16, wherein the constraints on the PCB stack up that limit the thickness of the PCB stack up comprise limits on a total thickness of the PCB stack up.

19. The storage device of claim 16, wherein the constraints on the PCB stack up that limit the thickness of the PCB stack up comprise limits on a thickness of each respective signal layer of the PCB stack up.

20. The storage device of claim 16, wherein the constraints on the PCB stack up that limit the number of signal layers comprise limits on a number of successive signal layers of the PCB stack up.

* * * * *